United States Patent
Oskowsky et al.

(10) Patent No.: US 6,377,117 B2
(45) Date of Patent: *Apr. 23, 2002

(54) METHOD AND SYSTEM FOR EFFICIENTLY TRANSMITTING ENERGY FROM AN RF DEVICE

(75) Inventors: Mark Oskowsky, San Jose; Darioush Agahi-Kesheh, Irvine, both of CA (US)

(73) Assignee: Conexant Systems, Inc., Newport Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/361,865
(22) Filed: Jul. 27, 1999
(51) Int. Cl.[7] ................................................. H03F 1/14
(52) U.S. Cl. ..................... 330/51; 124/124 R; 124/129
(58) Field of Search ............................. 330/51, 124 D, 330/124 R, 129

(56) References Cited

U.S. PATENT DOCUMENTS 4,598,252 A * 7/1986 Andricos ...................... 330/51
5,194,822 A * 3/1993 Bureau et al. ............... 330/129

* cited by examiner

*Primary Examiner*—Michael B Shingleton
(74) *Attorney, Agent, or Firm*—Scott A. Horstemeyer; Thomas, Kayden, Horstemeyer & Risley, LLP

(57) ABSTRACT

A method and system for efficiently transmitting RF energy from a RF device is disclosed. The method and system comprises a multi-stage power amplifier having a plurality of power amplifier stages arranged in parallel with associated switches for selectively switching on or off the plurality of power amplifier stages to produce a desired power level. By selectively switching on or off each individual power amplifier's associated switches at predetermined operating point's produces the desired power level for maximum efficiency. Additionally, more than one connected multi-stage power amplifiers each having a plurality of power amplifier stages arranged in parallel with associated switches for selectively switching on or off the plurality of power amplifier stages may be used to produce a desired power level.

20 Claims, 3 Drawing Sheets

METHOD AND SYSTEM FOR EFFICIENTLY TRANSMITTING ENERGY FROM AN RF DEVICE

BACKGROUND OF THE INVENTION

1. Field of the Invention

The present invention relates generally to power amplifiers used for transmitting RF energy and, in particular, to a multi-stage amplifier wherein the stages are arranged in parallel and switchably turned on or off to provide a desired plurality of power levels with each stage operating at a predetermined operating point.

2. Description of Related Art

A power amplifier of one type or another is used as the final stage in any RF transmission device. In a cellular telephone, for example, the power amplifier receives a signal as an input and then amplifies that signal to a power level that may be effectively coupled to an antenna and transmitted as RF radiation. Currently, most power amplifiers utilize multiple amplifier stages connected in series to form a multi-stage power amplifier. In the modem transceiver the transmitted power is adjusted by varying the series connected power amplifier's bias voltage or current.

However, by adjusting the bias voltage or current in a series connected multi-stage amplifier for a plurality of power levels, the efficiency is known to be 60% or less resulting in wasted power to heat. Therefore, there is a need for a multi-stage power amplifier that is capable of operating at a plurality of power levels at a higher overall average efficiency. The subject invention solves this problem in a new and unique manner not previously known in the arts.

SUMMARY OF THE INVENTION

The method and system comprises a multi-stage power amplifier having a plurality of power amplifier stages arranged in parallel with associated switches for selectively switching the plurality of power amplifier stages on or off to produce a desired power level.

Selectively switching on or off each individual power amplifier's associated switches at predetermined operating point's produces the desired power level for maximum efficiency. Additionally, more than one connected multi-stage power amplifier, each having a plurality of power amplifier stages, arranged in parallel with associated switches for selectively switching on or off the plurality of power amplifier stages may be used to produce a desired power level.

BRIEF DESCRIPTION OF THE DRAWINGS

The exact nature of the invention, as well as the preferred mode of use, and its objects and advantages will be readily understood by reference to the following detailed description of an illustrative embodiment when read in conjunction with the accompanying drawings in which like reference numerals designate like parts throughout the figures thereof, and wherein.

DETAILED DESCRIPTION OF THE PREFERRED EMBODIMENTS

Figure 1:
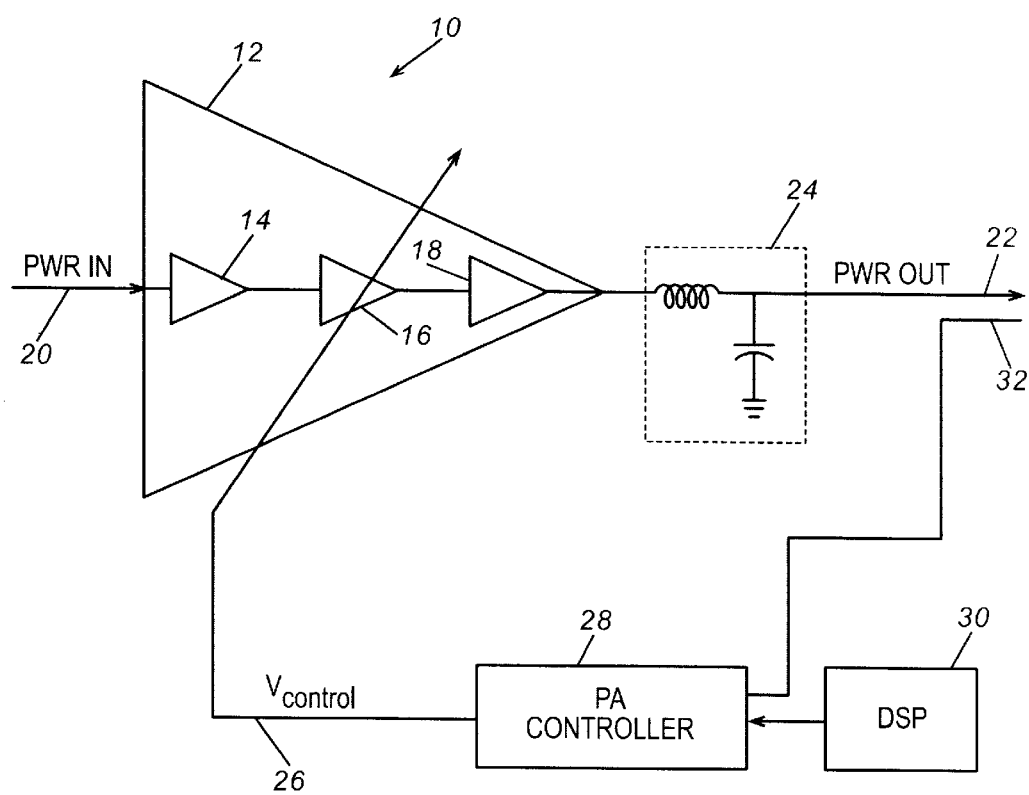
FIG. 1 is a block diagram of a prior art power amplifier system comprising a series configured arrangement of stages.

Referring now to the drawings, FIG. 1 shows a high-level block diagram of a prior art power amplifier system 10 comprising a series configured arrangement of power amplifier stages. The power amplifier system 10 utilizes a conventional, multi-stage power amplifier 12 wherein three separate power amplifier (PA) stages 14, 16 and 18, respectively, take a PWR IN 20 signal and through a matching network 24 produce a PWR OUT signal 22. The multi-stage amplifier of FIG. 1 uses several power amplifier stages rather than merely one power amplifier stage such that the overall PA 12 may achieve the desired amplification, approx., 20 dB gain, typically required by a cellular telephone with higher fidelity and with less probability of oscillation.

In many systems employing RF transmission, it is becoming more and more commonplace to require a plurality of power levels in a cellular telephone based on today's telecommunication standards. By way of example, but not of limitation, current mobile transmit stations (MTS) are required to transmit at 15 different power levels that are designated as PWR LVL 5 to PWR LVL 19 which vary in 2 dBm steps from 5 dBm to 33 dBm. The different power levels are determined by the cellular telephone's proximity to the MTS for maintaining an RF link. The multi-stage PA 12 of FIG. 1 implements the required power level by suitably controlling the voltage on a $V_{CONTROL}$ 26 line that is provided to each of the PA stages and may be suitably varied between two known values that are set in the factory during the calibration process. In an RF device (not shown) such as a cellular phone, the transceiver portion adjusts the transmitted power by varying the PA's 12 bias voltage or current through the $V_{CONTROL}$ 26 line by a PA controller 28 in response to the cellular phones digital signal processor (DSP) 30 which determines its location and associated power level with respect to its location to its MTS. The PA controller 28 further monitors the PWR OUT 22 by a coupler 32 to further tune and adjust the multi-stage PA 12, as shown in FIG. 1.

Figure 2:
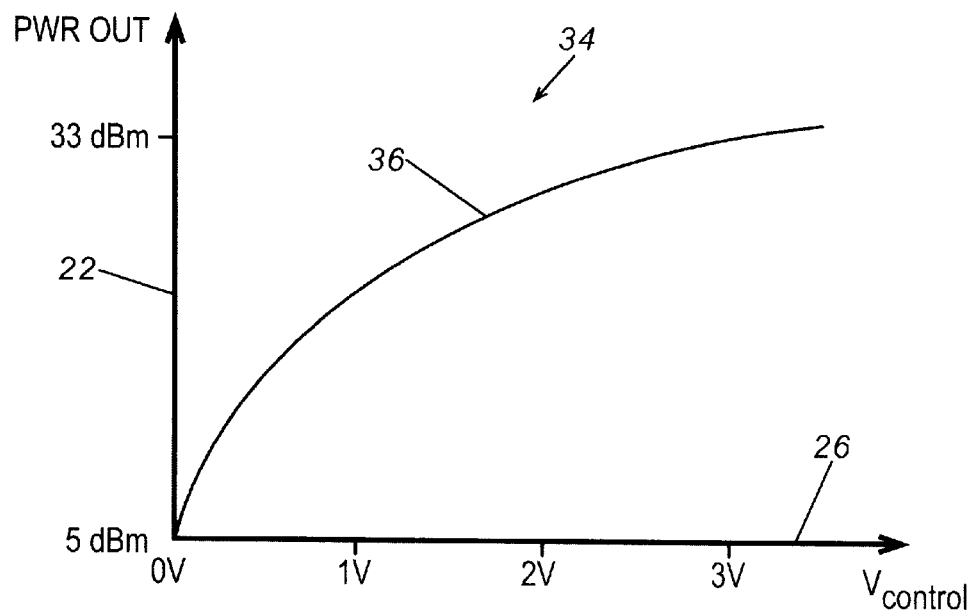
FIG. 2 is a graph showing the non-linear relationship between PWR OUT and the common control signal $V_{Control}$ provided to the stages of the power amplifier in FIG. 1.
Figure 3:
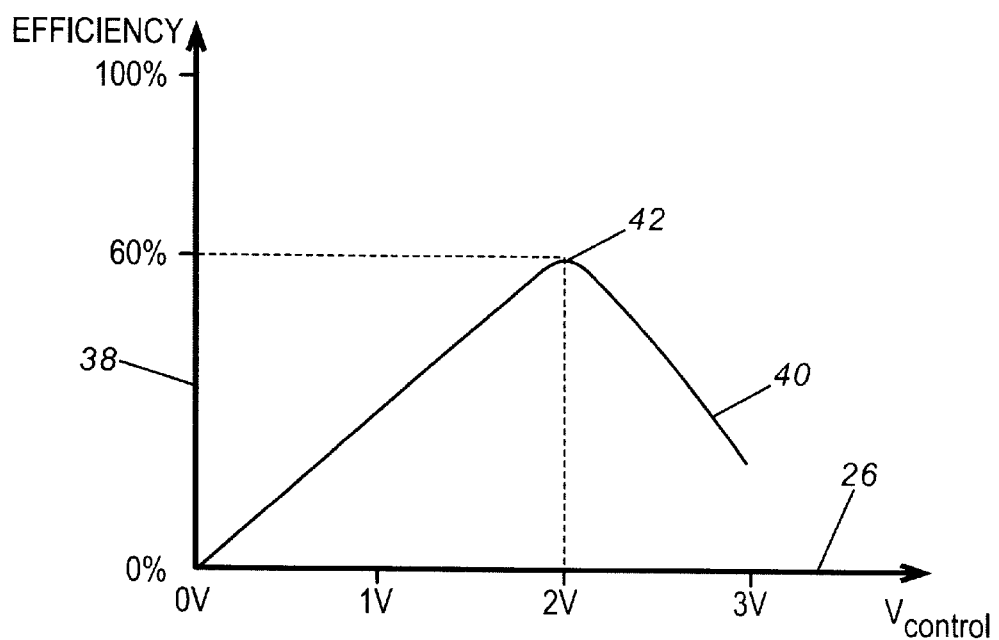
FIG. 3 is an efficiency curve showing the overall transmission efficiency as a function of the control signal.

Referring now to FIG. 2, there is shown a graph 34 depicting the non-linear relationship 36 between PWR OUT 22 and the common control signal $V_{CONTROL}$ 26 provided to the stages of the power amplifier 12 in FIG. 1. As shown by FIG. 2, the relationship 36 between PWR OUT 22 and $V_{CONTROL}$ 26 is not linear, as $V_{CONTROL}$ ranges from 0 to 3 volts. In addition, tuning to FIG. 3, there is depicted an efficiency curve 40 showing the overall transmission efficiency 38 as a function of the control signal 26. As shown by FIG. 3, the power amplifier has a maximum efficiency at a particular operating point 42 (e.g. 60% at 2 volts). Consequently, as the power amplifier 12 is variably set to different power levels, the overall efficiency of the power amplifier 12 is generally less than the maximum efficiency of 60%. If the transmitter's power amplifier always operates in the range identified as 5 dBm–33 dBm, then the power amplifier 12 has an overall average efficiency that is even less than 60% (e.g. 52%). As a result, approximately only one half of the power being inserted in the device is actually being transmitted as useful RF power, whereas the rest of the power is merely being dissipated as heat.

Operating as efficiently as possible is critical when it comes to a portable device. A 3-volt device that transmits at 2 watts of power at 100% efficiency, for example, draws two-thirds of an ampere. If that same device were to operate at 60% efficiency, its current draw when transmitting at 2 watts of power would increase to approximately 1.1 amperes. Given a typical battery capacity of only 1 ampere-hour, this 60% efficiency device would have a total transmit time or "talk time" of less than 1 hour.

Figure 4:
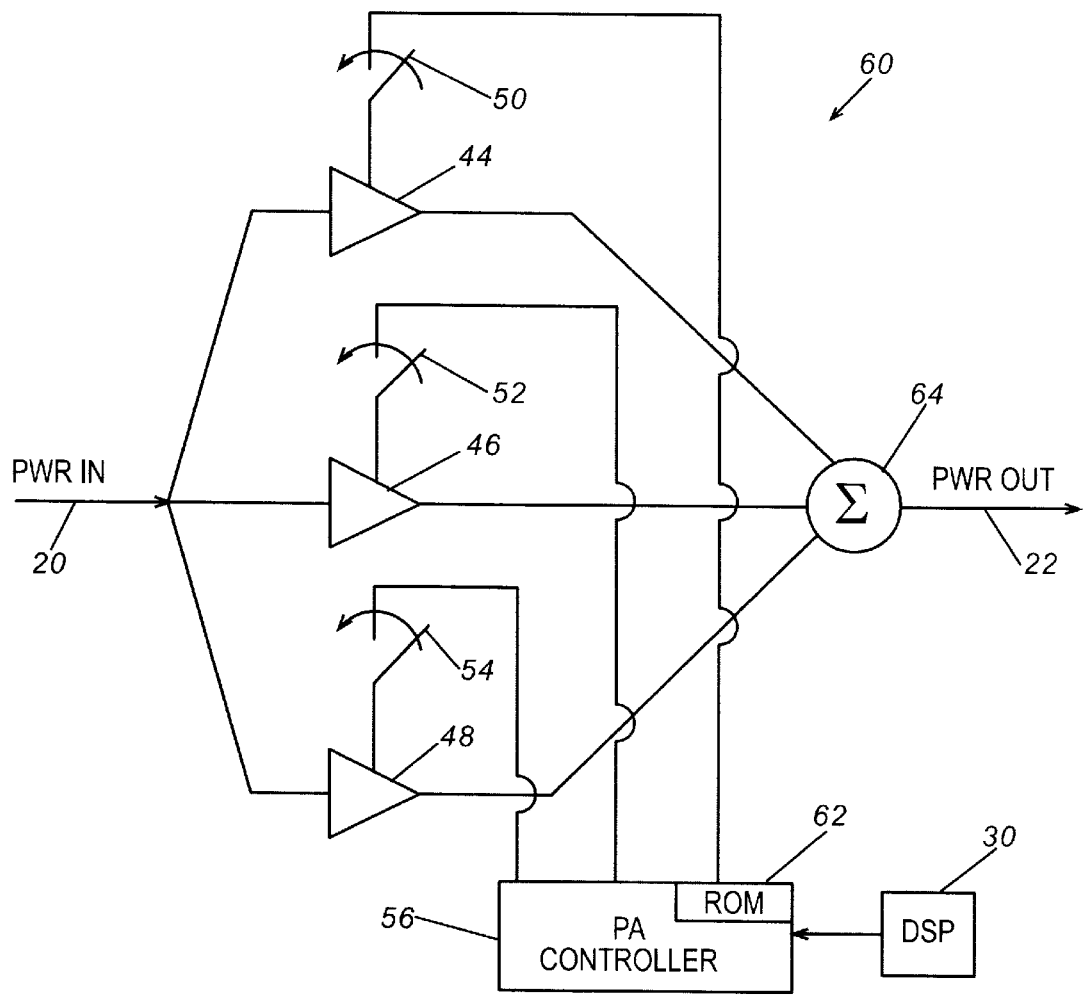
FIG. 4 is a block diagram of a multi-stage power amplifier according to the present invention having a plurality of parallel-arranged stages that are independently controlled between an OFF state and an ON state.

Referring now to FIG. 4, there is shown a block diagram 60 of the multi-stage power amplifier according to the present invention having a plurality of parallel-arranged power amplifier stages that are independently controlled between an OFF state and an ON state for maximizing the power in 20 to power out 22 efficiency to solve the above-described drawbacks. In accordance with the present invention, the method for efficiently transmitting RF energy from an RF device such as a cellular phone comprises the step of determining a desired power level for the power out 22 from a plurality of power levels for transmitting RF energy from an RF device based on its geographical location to a mobile transmit station. This information is processed within the digital signal processor (DSP) 30 and delivered to the power amplifier controller 56, as shown in FIG. 4. Within the power amplifier controller 56 is a read only memory (ROM) which stores a predetermined plurality of power levels and associated combinations for independently switching on or off one or more of the power amplifier stages. It should be understood that although a ROM is shown in FIG. 4, any memory device may be used.

From the desired power level delivered by the DSP 30, the PA controller 62 utilizing the stored information in the ROM 62 to selectively power or switch on or off the combination of power amplifier stages arranged in parallel for producing the desired power level. In one preferred embodiment, three power amplifier stages 44, 46 and 48 are arranged and connected in parallel to form a multi-stage power amplifier. By selectively switching on or off each individual power amplifier's associated switches 50, 52 and 54 at predetermined operating point's produces the desired power level (PWR OUT) 22 through summer 64 for maximum efficiency.

Although not shown, in another preferred embodiment, a plurality of multi-stage power amplifiers may be connected together wherein each multi-stage power amplifier has more than one power amplifier stage arranged in parallel for also selectively switching on or off one or more of the power amplifier stages in one or more multi-stage power amplifiers to produce the desired power level.

While the invention has been particularly shown and described with reference to a preferred embodiment, it will be understood by those skilled in the art that various changes in form and detail may be made therein without departing from the spirit and scope of the invention.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. method for efficiently transmitting RF energy from an RF device comprising the steps of:

determining a desired power level from a plurality of pre-set power levels for transmitting RF energy from an RP device; and selectively switching on or off one or more power amplifier stages arranged in parallel to produce the desired power level, wherein outputs of each of the one or more power amplifier stages are coupled to a summing junction.

2. A method for efficiently transmitting RF energy from an RF device comprising the steps of:

determining a desired power level from a plurality of pre-set power levels for transmitting RF energy from an RF device; and selectively switching on or off one or more power amplifier stages arranged in parallel to produce the desired power level, wherein outputs of each of the one or more power amplifier stages are coupled to a summing junction, and inputs of each of the one or more power amplifier stages are a power input.

3. A system for efficiently transmitting RF energy from an RF device comprising the steps of:

a plurality of power amplifier stages arranged in parallel;

a controller for determining a desired power level from a plurality of power levels for transmitting RF energy from an RF device; and a plurality of switches for selectively switching one or more power amplifier stages arranged in parallel on or off to produce the desired power level, wherein outputs of each of the one or more power amplifier stages are coupled to a summing junction.

4. A system for efficiently transmitting RF energy from an RF device comprising the steps of:

a plurality of power amplifier stages arranged in parallel;

a controller for determining a desired power level from a plurality of power levels for transmitting RF energy from an RF device; and a plurality of switches for selectively switching one or more power amplifier stages arranged in parallel on or off to produce the desired power level, wherein outputs of each of the one or more power amplifier stages are coupled to a summing junction, and inputs of each of the one or more power amplifier stages are a power input.

5. A multi-stage power amplifier comprising:

a plurality of power amplifier stages arranged in parallel; and switches associated with the plurality of power amplifier stages for selectively switching the plurality of power amplifier stages on or off to produce a desired power level, wherein outputs of the plurality of power amplifier stages are coupled to a summing junction.

6. A multi-stage power amplifier comprising:

a plurality of power amplifier stages arranged in parallel; and switches associated with the plurality of power amplifier stages for selectively switching the plurality of power amplifier stages on or off to produce a desired power level, wherein outputs of the plurality of power amplifier stages are coupled to a summing junction, and inputs of the plurality of power amplifier stages are a power input.

7. The method for efficiently transmitting RF energy according to claim 1, wherein each one of the power amplifier stages:

operate at a predetermined operating point for maximum efficiency.

8. The method for efficiently transmitting RF energy according to claim 1, wherein the power amplifier stages are arranged in parallel to form a multi-stage power amplifier, whereby selectively switching on or off one or more of power amplifier stages produces the desired power level.

9. The method for efficiently transmitting Rf energy according to claim 1, wherein the power amplifier stages utilizing three power amplifier stages arranged in parallel to form a multi-stage power amplifier, whereby selectively switching on or off individual power amplifier stages at predetermined operating points produces the desired power level at maximum efficiency.

10. The method for efficiency transmitting Rf energy according to claim 1, wherein one or more connected multi-stage power amplifiers are utilized, each multi-stage power amplifier having more than one power amplifier stage arranged in parallel; whereby selectively switching on or off one or more of the power amplifier stages in the multi-stage power amplifiers produces the desired power level.

11. The method for efficiently transmitting RF energy according to claim 1, wherein producing the desired power level, further comprises the step of:

storing the plurality of power levels and associated combinations for independently switching on or off the one or more power amplifier stages for use in selectively utilizing one or more power amplifier stages for producing a desired power level from the stored plurality of power levels.

12. The system according to claim 3, wherein each one of the power amplifier stages are operated at a predetermined operating point for maximum efficiency.

13. The system according to claim 3, further comprising:

switches for selectively switching one or more of three power amplifier stages arranged in parallel to form a multi-stage power amplifier on or off to produce the desired power level.

14. The system according to claim 3, further comprising:

switches for selectively switching one or more power amplifier stages arranged in parallel in one or more connected multi-stage power amplifiers on or off to produce the desired power level.

15. The system according to claim 3, further comprising:

memory for storing the plurality of power levels and associated combinations for independently switching the one or more power amplifier stages on or off.

16. The multi-stage power amplifier according to claim 5, wherein each power amplifier stage has predetermined operating points.

17. The multi-stage power amplifier according to claim 5, further comprising:

three power amplifier stages arranged in parallel to form a multi-stage power amplifier wherein selectively switching one or more of the three power amplifier stages on or off produces a desired power level.

18. The multi-stage power amplifier according to claim 5, further comprising:

three power amplifier stages arranged in parallel to form a multi-stage power amplifier wherein selectively switching individual power amplifier stages at predetermined operating points on or off produces a desired power level at maximum efficiency.

19. The multi-stage power amplifier according to claim 5, further comprising:

one or more connected multi-stage power amplifiers, each said multi-stage power amplifier having more than one power amplifier stage arranged in parallel wherein selectively switching one or more of said power amplifier stages in the one or more multi-stage power amplifiers produces a desired power level.

20. The multi-stage power amplifier according to claim 5, further comprising:

a ROM for storing a plurality of power levels and associated combinations for independently switching the plurality of power amplifier stages on or off for selectively utilizing the plurality of power amplifier stages to produce a desired power level from the stored plurality of power levels.

* * * * *